(12) United States Patent
Hughes et al.

(10) Patent No.: US 8,173,911 B2
(45) Date of Patent: May 8, 2012

(54) ELECTRONIC PACKAGE

(75) Inventors: Michael R. Hughes, Mason, NH (US); James Hebert, Derry, NH (US)

(73) Assignee: Flir Systems, Inc., Wilsonville, OR (US)

( * ) Notice: Subject to any disclaimer, the term of this patent is extended or adjusted under 35 U.S.C. 154(b) by 350 days.

(21) Appl. No.: 12/626,361

(22) Filed: Nov. 25, 2009

(65) Prior Publication Data
US 2010/0128456 A1 May 27, 2010

Related U.S. Application Data
(60) Provisional application No. 61/200,291, filed on Nov. 26, 2008.

(51) Int. Cl.
*H01R 4/48* (2006.01)
*H05K 9/00* (2006.01)
(52) U.S. Cl. ........................ 174/369; 174/386
(58) Field of Classification Search ............. 174/369, 174/370, 386, 366; 361/816
See application file for complete search history.

(56) References Cited

U.S. PATENT DOCUMENTS

| | | | |
|---|---|---|---|
| 4,736,069 A * | 4/1988 | Mullins ........................ | 174/385 |
| 4,988,550 A | 1/1991 | Keyser et al. | |
| 5,021,763 A | 6/1991 | Obear | |
| 5,120,578 A | 6/1992 | Chen et al. | |
| 5,216,431 A | 6/1993 | Sinyard et al. | |
| 5,473,111 A * | 12/1995 | Hattori et al. .................. | 174/363 |
| 5,561,265 A * | 10/1996 | Livshits et al. ................ | 174/386 |
| 5,571,991 A * | 11/1996 | Highum et al. ................ | 174/386 |
| 5,595,801 A * | 1/1997 | Fahy et al. .................... | 428/40.1 |
| 5,808,866 A | 9/1998 | Porter | |
| 5,909,490 A | 6/1999 | Sokolich | |
| 5,910,524 A | 6/1999 | Kalinoski | |
| 5,925,847 A * | 7/1999 | Rademacher et al. ........ | 174/372 |
| 5,982,253 A | 11/1999 | Perrin et al. | |
| 6,068,009 A * | 5/2000 | Paes et al. ..................... | 135/117 |
| 6,239,359 B1 | 5/2001 | Lilienthal, II et al. | |
| 6,355,878 B1 * | 3/2002 | Kim .............................. | 174/355 |
| 6,667,435 B1 * | 12/2003 | French et al. ................. | 174/369 |
| 6,763,576 B2 | 7/2004 | Watchko et al. | |
| 7,173,678 B2 | 2/2007 | Havelka et al. | |
| 7,288,727 B1 * | 10/2007 | Garcia .......................... | 174/369 |
| 7,446,264 B2 * | 11/2008 | Kouda et al. .................. | 174/356 |
| 7,446,265 B2 | 11/2008 | Krohto et al. | |
| 7,498,524 B2 * | 3/2009 | Brench ......................... | 174/354 |
| 7,504,591 B2 * | 3/2009 | Awaji ............................ | 174/355 |
| 2008/0273316 A1 | 11/2008 | Sarno | |

FOREIGN PATENT DOCUMENTS
WO  WO 2007065789 A1  6/2007

* cited by examiner

*Primary Examiner* — Hung Ngo
(74) *Attorney, Agent, or Firm* — Haynes and Boone, LLP

(57) ABSTRACT

The present invention relates to a device package, such as an electronic system package, that is suitable for use in harsh military or commercial environments. The package components, including a base enclosure and mating cover, comprise a series of interconnected electrically conductive materials, forming a tortuous electrically conductive path, that advantageously shield electromagnetic interference ("EMI"). The electrically conductive, EMI-shielding layers and other coated layers (e.g., insulative electrocoated paint layers) are smooth layers that provide corrosion resistance to the interior and exterior surfaces of the package. The package is also designed such that its components form a water tight seal. Thus, innovatively, the package comprises a combination of components that synergistically shield electromagnetic interference, resist interior and exterior corrosion, and form a water tight seal. The package is configured to pass military specification EMI and salt fog standard testing.

13 Claims, 3 Drawing Sheets

ELECTRONIC PACKAGE

CROSS-REFERENCE TO RELATED APPLICATIONS

The present application claims the benefit under 35 U.S.C. §119(e) of U.S. provisional application Ser. No. 61/200,291, filed on Nov. 26, 2008, the disclosure of which is incorporated by reference herein in its entirety.

FIELD OF THE INVENTION

Generally, the present invention relates to a device package, such as an electronic package, with a corrosion resistant, moisture-tight seal with electromagnetic interference shielding properties, and a method of making such a package. More specifically, the present invention relates to a corrosion resistant device package having a magnesium housing and mating plastic cover comprising a plurality of electrically conductive and interconnected components.

BACKGROUND OF THE INVENTION

It is a general problem that electronic devices and/or systems emit electromagnetic interference ("EMI") over various spectral bandwidths and the EMI emissions can be disruptive to the operation of the electronic device or system itself, or to independent but locally operating electronic devices or systems. While the EMI may be generated purposefully for various reasons, EMI is naturally produced by various electronic operations such as by fast current variations or the like. These can occur during the normal operation of electrical components such as resistors, capacitors, inductors, transistors, diodes, or the like. Alternately, fast current variations can be generated during the normal operation of motive electrical devices such as motors, solenoids or the like. In addition to EMI being generated by electrical components and motive electrical devices, current fluctuations along conductive pathways, e.g., through wires, bus bars, conductive traces, or the like leading to and from electrical components and motive electrical devices can also generate disruptive EMI emissions.

Generally, EMI emissions produce disruptive signal noise. The disruptive signal noise is generally at the EMI emission frequency and at harmonics thereof. Radio frequency interference ("RFI") bands, e.g., 50-1000 MHz, can be particularly disruptive to the operation of many devices by inducing disruptive radio signal noise into their otherwise noise-free signals. In particular, the operation of radio communication devices such as radio and television broadcasting systems, cellular telephone systems, and wireless computer network computers, and the like, can be adversely affected by RFI emissions emitted by unrelated devices.

Accordingly, EMI, and especially RFI emissions, in end-user products must be shielded or otherwise attenuated in a manner that reduces harmful EMI and RFI emissions to amplitude levels that are below the agreed upon EMI and RFI signal amplitudes at various signal bandwidths. Such amplitude levels are set by various regulatory agencies. Similarly, end-user products must also be capable of operating correctly when subjected to these same agreed upon EMI and RFI signal amplitudes levels at various bandwidths.

Additional problems are encountered when electronic devices and/or systems are used in harsh military or commercial environments. For instance, exposure to moisture, such as salt water or fog, may lead to corrosion or ingress of fluids. Accordingly, another desirable function of electronic device and/or system housings or packages is to resist corrosion and prevent fluid entry. Such systems that implement seals require a smooth interface to prevent water/moisture ingress. Most conductive paints are rough because of the metallic content of the paint.

Other functions of electronic devices and/or system housings or packages are to eliminate electrical shock hazards and to protect enclosed elements from damage by mechanical shock and or high g-forces. Other desirable functional characteristics of electronic device and/or system housings or packages are lightweight, easy of use, low cost, easy of manufacture and aesthetic appearance. Other desirable functional package characteristics may include forming a gas or liquid tight seal, ease of operator access, e.g., to replace a battery or the like, and a variety of convenient and functional interface access ports for providing electrical, mechanical, and other interfaces between the packaged electronic device or system and external devices or systems.

U.S. Pat. No. 6,763,576 to Watchko et al. discloses coating an interior surface of a housing with a metalized electrically conductive EMI shielding layer, which can include tin, nickel or an alloy of the two to resist corrosion. The housing can be made from magnesium or aluminum, among other metals, or plastics. The metal portion of the housing may be painted with a non-conductive paint. A conductive gasket may be used to provide electrical continuity between various mating housing parts. However, the reference does not disclose any means for protecting the exterior surface from corrosive materials, and the reference does not disclose masking any portion of the interior surface.

U.S. Pat. No. 7,446,265 to Krohto et al. discloses that electromagnetic interference shields may include an electrically conductive and grounded housing. The housing may be formed of a metal such as steel, aluminum, magnesium, or alternatively, a plastic or other polymeric material which is filled to form an electrically-conductive material. A conductive coating, such as an electrically-conductive paint, may be generally applied across the interior surfaces of the housing. A conductive gasket may be used to provide electrical continuity between different housing components. However, the reference does not disclose any means of protecting either the interior or exterior surface from corrosive materials, and the reference does not disclose masking any portion of the interior surface.

U.S. Patent Application Publication No. 2008/0273316 to Sarno et al. discloses a magnesium. Faraday shield, and U.S. Pat. No. 5,909,490 to Sokolich et al. discloses a magnesium EMI shield for a telephone. These references disclose the use of magnesium in EMI shields due to its low density and electrical conductivity. However, the references do not disclose any means of protecting either the interior or exterior surfaces from corrosive materials, and the references do not disclose masking any portion of the interior surface.

U.S. Pat. No. 4,988,550 discloses a masking tape for EMI shielding applications comprising, among other things, an adhesive layer and a metal foil layer adhered to the top of the adhesive layer. The tape is applied to a substrate that is sprayed with a paint, and the mask is then removed to reveal a conductive metal foil surface to which a conductive EMI shield can be mounted. However, the reference does not disclose a means of protecting both the interior and exterior surfaces from corrosive materials.

Thus, there still remains a need for an electronic package that comprises an electromagnetic shield, exhibits corrosion resistance on both the interior and exterior surfaces, and forms a water-tight seal.

SUMMARY OF THE INVENTION

The present invention concerns an electronic package comprising an electromagnetic interference shield having a series of interconnected electrically conductive components. The components form a tortuous electrically conductive path. Moreover, both the interior and exterior surfaces of the package are corrosion resistant, and the package further comprises a water tight seal.

BRIEF DESCRIPTION OF THE DRAWINGS

In the accompanying drawings, which form a part of the specification and are to be read in conjunction therewith and in which like reference numerals are used to indicate like parts in the various views.

DETAILED DESCRIPTION OF THE INVENTION

The present invention relates to a device package, such as an electronic system package, that is suitable for use in harsh military, industrial, or commercial environments. The package components, including a base enclosure and mating cover, comprise a series of interconnected electrically conductive materials, forming a tortuous electrically conductive path, that advantageously shield electromagnetic interference ("EMI"). The electrically conductive, EMI-shielding layers and other coated layers (e.g., insulative electrocoated paint layers) are smooth layers that provide corrosion resistance to the interior and exterior surfaces of the package. The device package is also designed such that its components form a water tight seal. Thus, innovatively, the package comprises a combination of components that synergistically shield electromagnetic interference, resist interior and exterior corrosion, and form a water tight seal.

Figure 1:
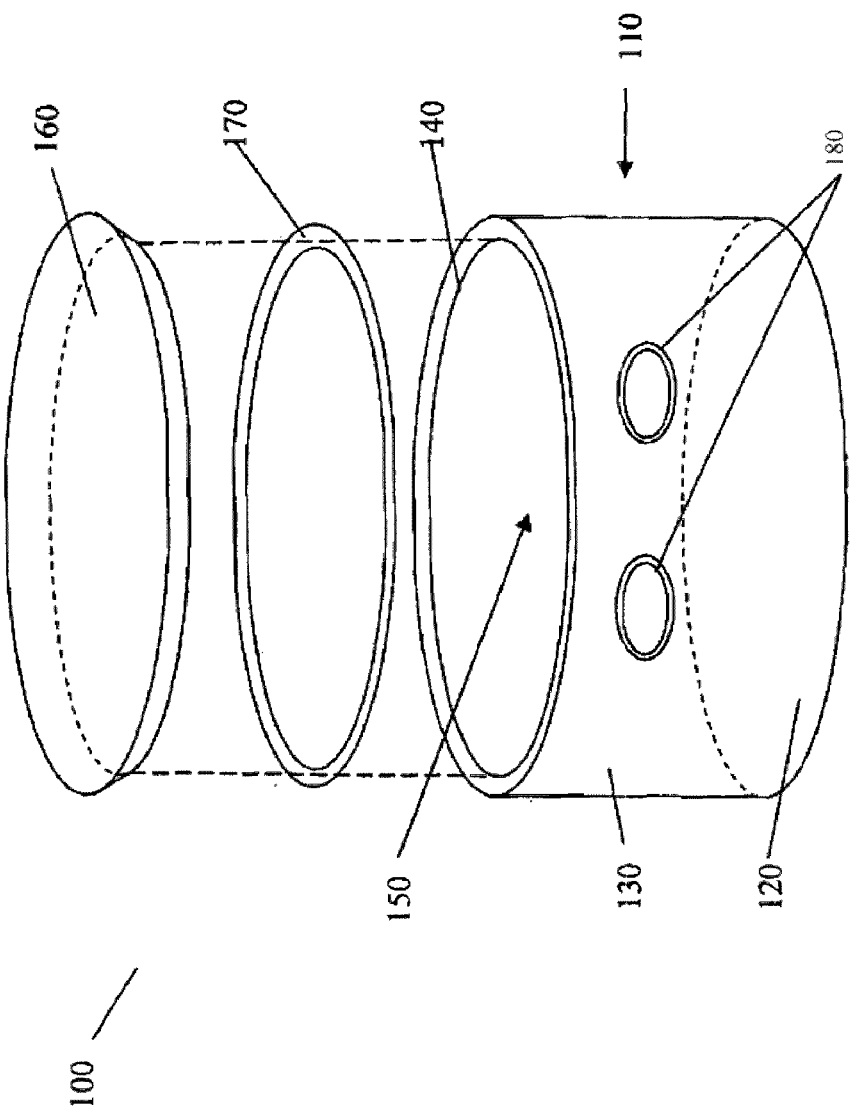
FIG. 1 illustrates an isometric exploded view of one example of an electronic system package according to the present invention.

FIG. 1 schematically illustrates an electronic system package 100, which is shown in exploded isometric view. The system package 100 includes a cylindrical base enclosure 110. However, base enclosure 110 can be any size and shape. In the present example, base enclosure 110 includes a bottom wall 120, which is attached to a side wall 130. A top edge of the side wall 130 forms an aperture 140 that permits access into the cylindrical base enclosure 110, which encloses a hollow cavity 150. Ideally, the base enclosure 110 is a unitary element but may be formed from various elements that are attached together by various mechanical means.

Electronic system package 100 further includes a cover element 160. Cover 160 is sized and dimensioned to mate with the aperture 140, and to attach to base enclosure 110 to seal the hollow cavity 150. Electronic system package 100 further includes a gasket 170, which is sized to be captured between the top edge of cylindrical side wall 130 and cover 160. In addition, one or both of the top edge of side wall 130 and cover element 160 may include features such as channels or retainers for capturing and/or positioning gasket 170 in a desired position.

An electronic device or system, not shown, is housed within hollow cavity 150. Electronic device or system includes any device or system that emits electro-magnetic fields or is affected by same. Electronic device or system includes devices that emit or receive infrared radiation, such as IR cameras or sensors and IR binoculars or vision systems. The electronic device or system may be mechanically fastened to base enclosure 110 or to cover 160. In addition, one or both of base enclosure 110 and cover 160 may comprise a conductive element formed from an electrically conductive material, or base enclosure 110 and/or cover 160 may be formed with one or more electrically conductive layers formed therein or thereon, such that one or both of base enclosure 110 and cover 160 may become an element of the electrical device or electrical system. For example, base enclosure 110 and/or cover 160 can form an EFI shield or an antenna, among other things. Furthermore, base enclosure 110 and/or cover 160 can provide an electrical pathway from the interior of system package 100 to the outside.

Electronic system package 100 may further include a plurality of apertures 180 passing through any wall of the system package 100. Apertures 180 may comprise interface ports and may include electrical connectors, mechanical interfaces, fluid or gas ports, optical apertures, electromagnetic signal emitters and/or antennas, or any other aperture type as may be required. Generally, electronic system package 100, according to the present invention, is constructed as a corrosion resistant, water and moisture tight Faraday cage or shell or an EMI shield, preferably with base enclosure 110 comprising magnesium and cover 160 comprising a lighter weight injection moldable plastic.

Figure 2:
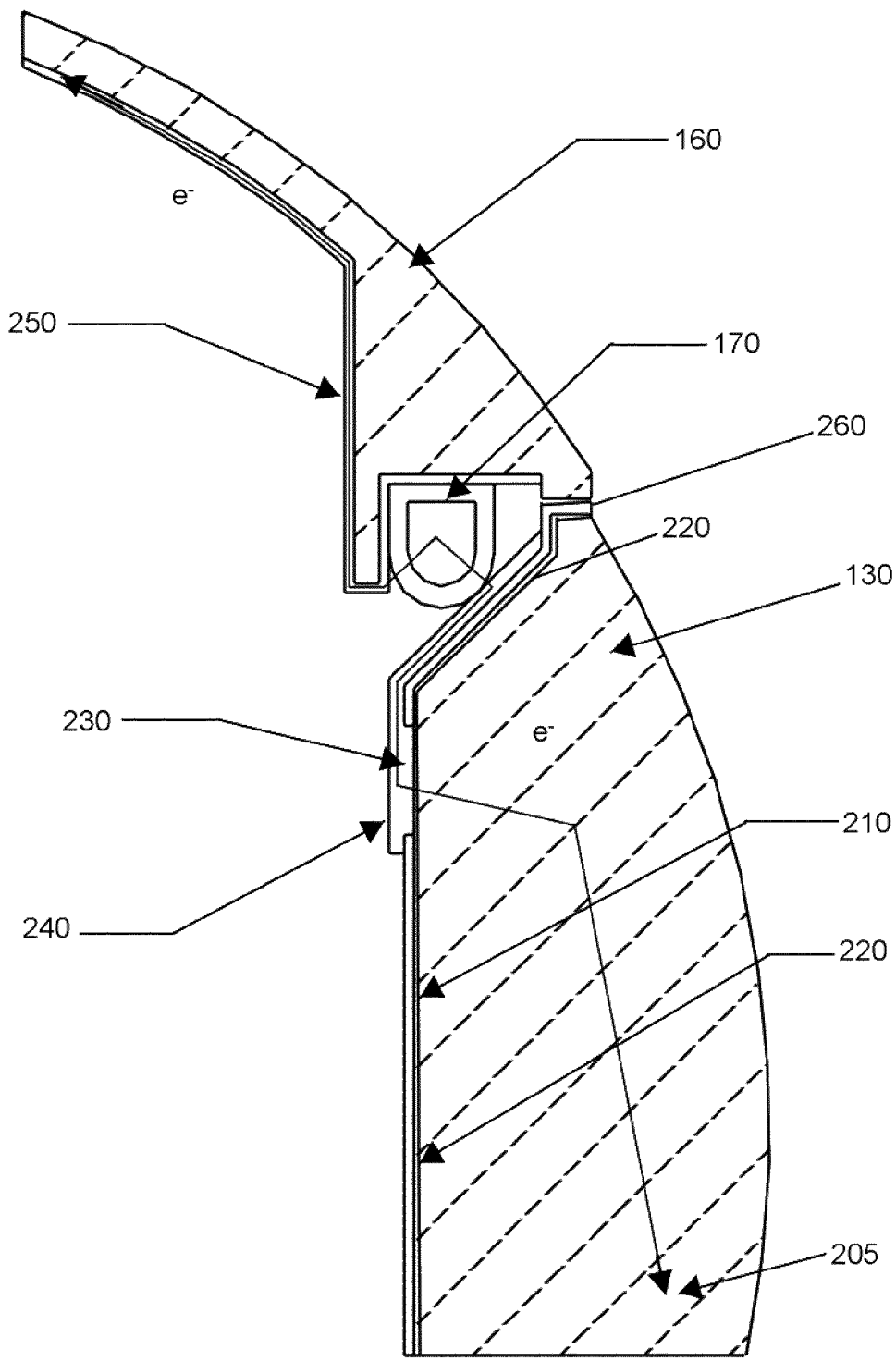
FIG. 2 illustrates a section view taken through one example of an electronic system package according to the present invention.

Referring now to FIG. 2, a partial sectional view taken through a top right portion of electronic system package 100 shows a top portion of side wall 130 where it mates with cover 160. As is further shown, gasket 170 is captured between side wall 130 and cover 160. In a preferred embodiment, substantially the entire base enclosure 110 comprises magnesium or a magnesium alloy that is treated for corrosion resistance, especially against salt water and salt fog. Magnesium is preferred due to its light weight and conductivity. Other lightweight and conductive materials such as aluminum, stainless steel, conductive polymers, or polymers with conductive coatings(s) can also be used. Similarly, cover 160 preferably comprises a durable injection moldable plastic material (e.g., urethane) with high impact strength and resistance to corrosive elements. Cover 160 is coated on one side with an electrically conductive coating or layer, described below. The preferred gasket 170 is an electrically conductive gasket such as silver, copper, aluminum, nickel or alloys thereof, and preferably a material that has a low anodic reaction with magnesium. The importance of having an electrically conductive gasket is that it provides electrical continuity between other components of the electronic system package 100, i.e., base enclosure 110 and cover 160, thereby facilitating the formation of a Faraday cage or EMI shield.

Generally, an EMI shield is a barrier that confines EMI energy within one device and insulates that device from the EMI energy emitted by neighboring devices or from the surrounding environment. A Faraday cage is a particular type of EMI shield that is constructed from conducting materials. It blocks the effects of external electrical fields, because such external fields would produce a current on the Faraday cage but would not affect the functions of electrical systems, contained within the Faraday cage.

In the present invention, system package 100 forms an EMI-shielding Faraday cage, which is preferably constructed from a series of conductive materials that form a tortuous electrically conductive path 205, which continuously extends from the electrically conductive internal surfaces of cover 160, through conductive gasket 170, and into conductive base enclosure 110. The tortuous electrical conductive path 205 shown in FIG. 2 is a serpentine or labyrinth electrical circuit for the flow of electrons. System package 100, which forms tortuous electrical conductive path 205, is also designed to provide a better seal between cover 160 and base enclosure 110 against moisture and corrosive elements.

To protect against corrosion, electronic system package 100 is preferably coated with a corrosion resistant coating on one or more of its internal or external surfaces. Preferably, components that are made at least in part from metal are coated with a corrosion resistant coating. In one embodiment, base enclosure 110, which is preferably made from magnesium for high strength and electrical conductivity, is coated with an anti-corrosion coating that has a sufficient smoothness to cover the metal. Without being bound to any particular theory, the inventors of the present invention have discovered that the smoothness of the coating is advantageous against corrosion, because the smoothness of the coating minimizes microcracks from developing in the coating for corrosive agents, such as salt water or salt water vapor, to penetrate and attack the underlying metal. More advantageously, a smooth coating is also resistant to cracking due to thermal expansion and contraction of the underlying metal. It is known that metals have a high coefficient of thermal expansion. As metals, such as magnesium, expand and contract, microcracks represent stress concentrations that could compromise the integrity of the coating thereby exposing the metal to corrosive agents. Suitable anti-corrosion coatings include electrocoating, described below, which provide sufficient smoothness.

Referring back to FIG. 2, side wall 130 of base enclosure 110 is coated with anti-corrosion layer 220 on its internal surface as well as its external surface (not shown). An opening 230 is provided to allow side wall 130 and base enclosure 110 to be connected electrically to gasket 170 and cover 160. In other words, opening 230 is a conductive access point, such as busbar, which may be masked from electrocoating.

Conductive coating layers, including but not limited to those commercially available as CHO-SHIELD® 2000 series (commercially available from Chomerics of Woburn, Mass., a division of Parker Hannfin Corporation), are applied to certain internal surfaces of system package 100 in order to form portions of the electrical path 205 of the inventive Faraday cage. The preferred CHO-SHIELD 2000 series coatings are advantageous because they are lightweight and resistant to corrosive materials. In the present invention, conductive coating layer, preferably CHO-SHIELD 2002, which can adhere to polymers and which comprises a urethane binder with conductive copper filler, may be sprayed to coat the internal surface of cover 160, thereby forming conductive layer 250. Another conductive layer, preferably CHO-SHIELD 2003, which can adhere to metal and which also comprises a urethane binder with a conductive copper filler, may be sprayed to overlay portions of sidewall 130 of magnesium housing 110, thereby forming conductive layer 240. Conductive layer 240 carries electrical conductive path 205 to opening 230 and protects 230 in side wall 130 from corrosion. In this embodiment, electrical conductive path 205 comprises conductive layer 250 on cover 160, gasket 170, conductive layer 240 on side wall 130 that overlays opening 230 and the magnesium box enclosure 110.

Top cover 160 is preferably formed from a durable injection moldable plastic material such as urethane, and it is inherently able to withstand corrosion. The base enclosure 110 is preferably made of magnesium or a magnesium alloy, such as preferably the AZ31B magnesium-based alloy. Per standard ASTM International nomenclature, the AZ31B magnesium alloy has composition of approximately 3 wt. % aluminum (Al), 1 wt. % zinc (Zn), and the balance is substantially magnesium. Magnesium has a relatively high tensile strength (about 160 to 365 MPa, or about 23 to 53 ksi) and a relatively low density (about 1.738 g/cm$^3$, which is approximately two-thirds the density of aluminum), which advantageously yield a relatively high strength-to-weight ratio (i.e., tensile strength/density). Accordingly, magnesium's strength and light weight make it a preferred metal for designing electronic system package 100, which may contain therein a variety of products including, but not limited to, IR cameras, IR binoculars, laptops, portable military equipment, and the like. Additionally, magnesium has good electrical conductivity (about 38.6% of IACS, or, the International Annealed Copper Standard), thereby allowing it to form a portion of the Faraday cage discussed above. Magnesium has a relatively high thermal conductivity (about 154.5 W·m$^{-1}$·K$^{-1}$) that is useful for dissipating thermal energy to the surrounding air. The aforementioned magnesium property values are from "Magnesium and Magnesium Alloys" in *Metals Handbook Desk Edition*, Second Edition, J. R. Davis (Ed.), 1998, p. 559-574, which is incorporated herein by reference in its entirety.

Magnesium, however, is susceptible to corrosion, because it is among the more electrochemically active structural metals. Consequently, magnesium has a high thermodynamic tendency to be corroded by water, and especially salt water or salt fog. Moreover, magnesium can also undergo so-called galvanic corrosion when exposed to other metals such as the metals contained in the electronic equipment protected by electronic system package 100. As discussed above, preferably, in the present invention, an electrocoating ("E-coat") paint process is used to coat the magnesium-based enclosure 110 in both the interior and exterior with a layer 220. As used herein, the term "electrocoating" is defined herein to mean any "method of painting where an electrically conductive work-piece is immersed in a paint bath and is coated by the application of electricity. Electrocoat is also referred to as E-coat, electrophoretic paint, electrodeposition paint, electrodip and electropaint." See Peter Hope, "Electrolyte Control in Small Scale Industrial Electrocoat Painting Processes," in *Electrophoretic Deposition, Fundamentals and Applications: Proceedings of the International Symposium*, A. Boccaccini et al. (Eds.), 2002, p. 167-174, which is incorporated herein by reference in its entirety. Similarly, electrocoat and electrocoated elements are coating or elements coated by the electrocoating process.

Electrocoating generally offers several advantages including automation, efficiency, low cost, and low emissions. More particularly, with respect to the present invention, it has been found that an E-coat paint process produces a smooth, durable finish—comparable to powder paint—that protects the metal, particularly magnesium, surface from corrosive elements. Powder paint is a coating or paint prepared by coating or spraying an element or object with electrostatically charged powder. The coated element is then heated to cure the powder in case of thermosetting powder or to melt the powder in case of thermoplastic powder. The paint powder can be ground to a fine powder to produce a smooth coating. Alternatively, CHO-SHIELD, which is also a smooth, corrosion resistant material, and powder paint can be used to coat magnesium-based housing 110. However, CHO-SHIELD is a relatively more expensive material than electrocoating and powder painting, and its use is preferably limited to select, masked-portions of housing 110, e.g. opening 230.

Before the magnesium-based housing 110 is electrocoated, substantially the entire magnesium-based housing 110 is coated with a chromate layer 210, which seals magnesium-based housing 110 and primes its surface for other coating layers. More particularly, a chromate chemical-conversion treatment converts the alkaline surface of magnesium to a more neutral pH, thereby allowing subsequently applied coatings to provide improved corrosion resistance. A variety of chromate treatments are known in the art including NH 35 (yellow chromate), or the Dow 19 chromate process, or any suitable process that conforms to the specification of SAE AMS-M-3171 Type VI (Society of Automotive Engineering, Aerospace Materials Specification), formerly MIL-M-3171 Type VI, which is incorporated herein by reference in its entirety.

After pretreating with chromate, substantially the entire magnesium housing 110, both on the interior and the exterior, is painted by an E-coat process to form anti-corrosion layer 220. An electrocoating process is based on the physical principle that opposite electrical charges are attracted to each other. Accordingly, in an E-coat process, pretreated metal parts such as magnesium housing 110 are dipped in a bath comprising deionized water (approximately 80-90 wt. %) and resinous paint (approximately 10-20 wt. %). The paint particles migrate under the influence of an electric field and are deposited onto an oppositely charged, chromate-treated magnesium surface. This process continues until substantially the entire surface is uniformly and smoothly coated with a paint that protects the underlying chromate-treated magnesium surface from corrosion. Thus, the process is an improvement over spraying and other means that may inadvertently leave certain areas unprotected from corrosion. After dipping in the paint bath, a metal part is removed, rinsed, and then cured so as to crosslink the resinous paint solids.

Generally, the electrocoating process can be anodic or cathodic and employ epoxy, acrylic, among other resins. In the anodic process, negatively charged paint particles are deposited on a positively charged metal part (serving as the anode), whereas in a cathodic process, positively charged paint particles are deposited on a negatively charged metal part (serving as the cathode). Epoxy electrocoatings are generally employed for improving corrosion resistance, whereas acrylic electrocoatings are generally employed for improving resistance to UV exposure. While any suitable electrocoating may be used, the present invention preferably uses a cathodic epoxy coating, such as epoxy coatings commercially available from Valmont Coatings Applied Coating Technology of Mendota Heights, Minn.

As discussed above, some areas of the magnesium housing 110 are intentionally masked from the E-coat paint to provide electrical access to base enclosure 110. In particular, any area of the magnesium housing 110 that will serve as a conductive pad, or the like, is masked from the E-coat paint process and/or the chromate priming process so as to maintain a path for electron flow into housing 110. One means of masking involves covering a particular area such as opening 230 with methyl-ethyl-ketone ("MEK") or equivalent solvent. Other means, as disclosed in U.S. Pat. No. 4,988,550, which is incorporated herein by reference in its entirety, involve using a masking tape to cover select areas during the E-coat paint process.

Particularly, in the present invention, opening 230 proximate aperture 140 is masked from the E-coat paint process. Masking may also be used before the appliance of the chromate priming process. Opening 230 is thereafter coated with a conductive material layer such as CHO-SHIELD® 2003. The CHO-SHIELD 2003 makes electrical contact with opening 230 and overlays the E-coat paint to a top edge of the top wall 260 to make electrical contact with gasket 170. In addition, other apertures passing through the magnesium housing 110 may be similarly masked.

According to another aspect of the present invention, the conductive gasket 170 as well as the mating edges of each of the top cover 160 and the side wall 130 of magnesium housing 110 are formed to fit together as a labyrinth that prevents moisture from passing therethrough. In other words, these various components form a water tight seal, which helps prevent the ingress of moisture at the conjunction of top cover 160 and magnesium housing 110.

An experiment was conducted to test the corrosion resistance, upon exposure to salt fog, of conductive gasket 170 and bottom e-coated magnesium housing 110. The experiment utilized test methods described in MIL-STD 810F military standard as well as CHO-TM100 (copy available from Chomerics of Woburn, Mass., a division of Parker Hannfin Corporation), which are both incorporated by reference in their entireties. In the experiment, test coupons were cycled in a salt fog chamber for 24 hour intervals, with 24 hours of drying in between, over a period of about five days. Deionized water was used in the coupon cleaning step.

As noted in Table 1 below, four magnesium test coupons comprising four layers were used in this experiment. For each test coupon, the bottom layer was comprised of magnesium (Mg). For test coupons 1 and 3, the bottom magnesium layer was coated with a chromate primer NH 35, whereas for test coupons 2 and 4, the bottom magnesium layer was electrocoated. For each test coupon, the NH 35 or electrocoated layer were overlayed with a conductive layer, e.g. CHO-SHIELD 2003. For test coupons 1 and 4, the CHO-SHIELD 2003 layer was overlayed with CHO-SEAL 1298 ("CS1298"), a conductive gasket (commercially available from Chomerics of Woburn, Mass., a division of Parker Hannfin Corporation) having a silver-aluminum (Ag—Al) conductive filler. For test coupons 2 and 3, the CHO-SHIELD 2003 was overlayed with CHO-SEAL 6308 ("CS6308"), a conductive gasket (commercially available from Chomerics of Woburn, Mass., a division of Parker Hannfin Corporation) having a nickel-carbon (Ni—C) conductive filler.

Table 1 below notes the weight loss of each test coupon, the average initial and final electrical resistivities, average thickness change, and observations about corrosion. The electrical resistivities are measures of a test coupon's ability to provide EMI shielding.

|  | Test Coupon 1 (CS1298/ CS2003/NH35/Mg) | Test Coupon 2 (CS6308/ CS2003/E-coat/Mg) | Test Coupon 3 (CS6308/ CS2003/NH35/Mg) | Test Coupon 4 (CS1298/ CS2003/E-coat/Mg) |
|---|---|---|---|---|
| Weight loss (mg) | 335.1 | 29.2 | 184.9 | 64.9 |
| Weight lost (%) | 6.5 | 0.6 | 3.7 | 1.3 |
| Average mOhm cm (initial) | 6.3 | 40.2 | 38.2 | 6.2 |

|  | Test Coupon 1 (CS1298/ CS2003/NH35/Mg) | Test Coupon 2 (CS6308/ CS2003/E-coat/Mg) | Test Coupon 3 (CS6308/ CS2003/NH35/Mg) | Test Coupon 4 (CS1298/ CS2003/E-coat/Mg) |
|---|---|---|---|---|
| Average mOhm cm (final) | 29.7 | 86.7 | 93.0 | 14.3 |
| Average thickness change (%) | 0.16 | −0.61 | −5.3 | 2.0 |
| Observations | Metal loss and deep fracturing of outer edge. Also, de-lamination of CS2003 on back-side. | Slight pitting in a couple of areas of outer edge. Otherwise the coating and coupon were intact. | Metal loss and moderate fracturing of outer edge. Also, some de-lamination of CS2003 on front and backside. | Slight to moderate pitting around outer edge. Otherwise, the coating and coupon were intact. |

From the experimental results synopsized in Table 1, it is apparent that test coupons 2 and 4, comprising CS2003/E-coated magnesium, provided the most protection in preventing galvanic corrosion after 48 hours of salt fog exposure, as noted by 0.6% and 1.3% weight loss, respectively. Test coupons 1 and 3, comprising CS2003/NH-35 coated magnesium, did not provide sufficient protection in preventing galvanic corrosion, as noted by the 6.5% and 3.7% weight loss, respectively.

Test coupon 2, comprising a CS6308 conductive gasket, was about 1.8 to about 2.2 times less corrosive than test coupon 3, comprising a CS1298 conductive gasket. Thus, test coupon 2 provided the better combination of material and coatings for protecting magnesium flanges in a corrosion environment.

Figure 3:
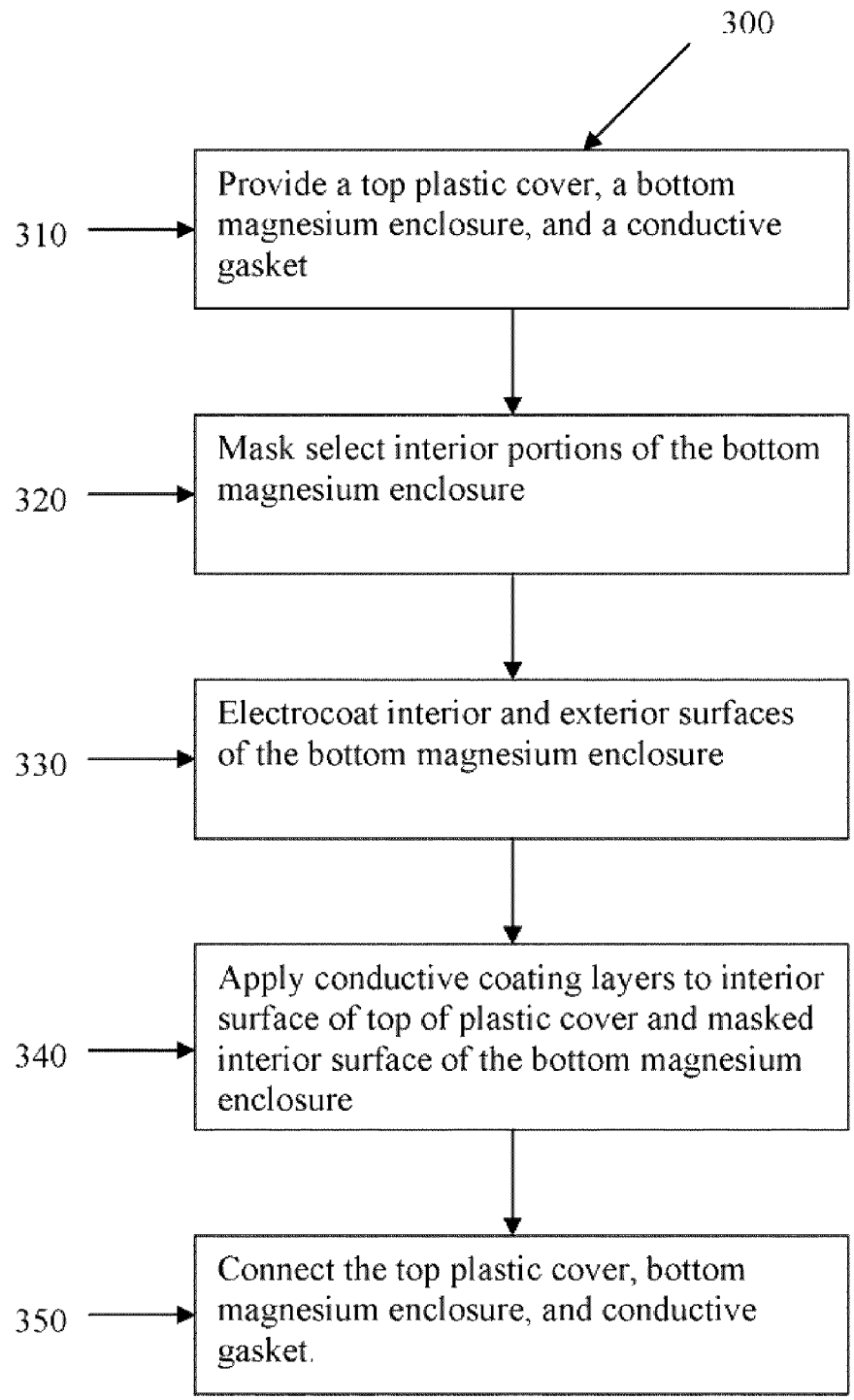
FIG. 3 is a flow chart depicting a method of shielding an electronic system package according to the present invention.

In another experiment, the entire inventive electronic system package 100, housing an infrared camera, as shown in FIGS. 1-3 and described herein, was subjected to the salt fog conditions described in MIL-STD 810F for five days and passed.

FIG. 3 is a flow chart depicting an exemplary method 300 for shielding an electronic system package 100 according to the present invention. In a first step 310, a top plastic cover 160, a bottom magnesium enclosure 110, and a conductive gasket 170 are provided. In a second step 320, select interior portions of the bottom magnesium enclosure 110, such as conductive pads, are masked. In a third step 330, both interior and exterior surfaces of the bottom magnesium enclosure 110 are electrocoated. The surfaces may be optionally pre-treated with chromium before this third step. In a fourth step 340, conductive coating layers 240, 250 are applied to the interior surfaces of the bottom magnesium enclosure 110 and the top plastic cover 160, respectively. Preferably, conductive coating layer 240 is applied on select interior portions of housing 110, such as masked areas. In a fifth step 340, the top plastic cover 160, bottom magnesium enclosure 110, and conductive gasket 170 are connected together.

While it is apparent that the illustrative embodiments of the invention disclosed herein fulfill the objectives of the present invention, it is appreciated that numerous modifications and other embodiments may be devised by those skilled in the art. Additionally, feature(s) and/or element(s) from any embodiment may be used singly or in combination with other embodiment(s). Therefore, it will be understood that the appended claims are intended to cover all such modifications and embodiments, which would come within the spirit and scope of the present invention.

The invention claimed is:

1. An electronic system package comprising an electrical conductive path therewithin, said electronic system package comprises:

a first member, a second member, and an electrically conductive gasket positioned between the first member and the second member, wherein the first member, the gasket and the second member form a housing for an electronic equipment, wherein all the surfaces of the first member except for at least one opening portion is covered with a corrosive-resistant electrocoating or with a corrosive resistant powder-painted coating, wherein a portion of the surfaces of the first member including said at least one opening is covered with a first electrically conductive coating, wherein a surface of the second member is covered with a second electrically conductive coating, wherein the electrical conductive path comprising the second electrically conductive coating, the gasket, the first electrically conductive coating and the metallic material of the first member is formed within the electronic package system.

2. The electronic system package of claim 1, wherein the second electrically conductive coating covers an interior surface of the second member.

3. The electronic system package of claim 1, wherein the first member comprises a base enclosure.

4. The electronic system package of claim 1, wherein the second member comprises a cover.

5. The electronic system package of claim 1, wherein the first member comprises an electrically conductive metallic material.

6. The electronic system package of claim 5, wherein the electrically conductive metallic material comprises magnesium or magnesium alloy.

7. The electronic system package of claim 1, wherein the second member comprises a polymeric material.

8. The electronic system package of claim 1, wherein a priming layer is disposed between the first member and the first electrically conductive coating.

9. The electronic system package of claim 8, wherein the priming layer comprises a chromate layer.

10. The electronic system package of claim 1, wherein either the first or the second conductive coating comprises a urethane binder with dispersed conductive metal fibers contained therein.

11. The electronic system package of claim 1, wherein the at least one opening is formed on an interior of the housing.

12. The electronic system package of claim 1, wherein the electrical conductive path forms an EMI shield.

13. The electronic system package of claim 1, wherein the first and second conductive coatings are substantially similar to each other.

* * * * *